United States Patent [19]
Nishioka

[11] 4,339,631
[45] Jul. 13, 1982

[54] PHASE CONTROL DEVICE

[75] Inventor: Akira Nishioka, Tokyo, Japan

[73] Assignee: Pioneer Electronic Corporation, Tokyo, Japan

[21] Appl. No.: 123,312

[22] Filed: Feb. 21, 1980

[30] Foreign Application Priority Data

Dec. 1, 1978 [JP] Japan ................... 53-149481

[51] Int. Cl.³ ........................................... H04H 5/00
[52] U.S. Cl. ............................. 179/1 GS; 328/155; 307/512
[58] Field of Search ............... 179/1 GS, 1 GD; 328/133, 134, 155; 307/511, 512

[56] References Cited

U.S. PATENT DOCUMENTS

| | | | |
|---|---|---|---|
| 3,624,274 | 11/1971 | Araki | 328/155 |
| 4,087,737 | 5/1978 | De Gennaro | 328/155 |
| 4,218,586 | 8/1980 | Parker et al. | 179/1 GS |
| 4,273,958 | 6/1981 | Hirata | 179/1 GS |

FOREIGN PATENT DOCUMENTS 55-75359  6/1980  Japan .................. 179/1 GS

Primary Examiner—Douglas W. Olms
Attorney, Agent, or Firm—Sughrue, Mion, Zinn, Macpeak & Seas

[57] ABSTRACT

A phase control circuit for use in a compatible quadrature AM stereophonic receiver in which the phase of the output signal of a voltage-controlled oscillator in a phase-locked loop circuit has a fixed predetermined phase difference with respect to the input signal at all times. A variable phase shifter varies the phase of the output signal from the voltage controlled oscillator in the phase-locked loop circuit in accordance with an input control voltage. The phase of the output of the variable phase shifter is compared with the phase of the input intermediate frequency signal to produce a control signal voltage for the variable phase shifter which varies according to the phase difference between the two compared signals wherein the desired signal having a fixed phase difference is provided at the output of the variable phase shifter.

5 Claims, 4 Drawing Figures

PHASE CONTROL DEVICE

BACKGROUND OF THE INVENTION

The present invention relates to phase control devices and more particularly to a received signal phase control device employed in a modulation circuit for a compatible quadrature AM stereophonic signal which is compatible with both stereophonic and monophonic receivers.

An AM stereophonic signal produced with a compatible quadrature phase modulation (PM) system is known as a stereophonic signal. Such a stereophonic signal $e_i$ can be, in general, expressed by the following equation (1):

$$e_i = [\{1 + k[L(t) + R(t)]\} \cdot \cos \omega it + k[L(t) - R(t)] \cdot \cos (\omega it + \pi/2)] \cdot \cos \phi. \quad (1)$$

where $\phi = \tan^{-1} k[L(t) - R(t)]/\{1 + k[L(t) + R(t)]\}$, $L(t)$ and $R(t)$ are the left and right channels, respectively, $\omega i$ is the angular frequency of the carrier signal, and $k$ is the modulation factor.

That is, the compatible quadrature AM stereophonic signal expressed by the equation (1) is a combination of a signal which is produced by modulating the amplitude of the carrier signal, $\cos \omega it$, with a signal corresponding to the sum of the two channel signals and a signal which is produced by modulating the amplitude of the carrier signal phase shifted by 90°, $\cos (\omega it + \pi/2)$, with a signal corresponding to the difference between the two channel signals. In order for the stereophonic signal to be usable by a monophonic receiver, signal transmission is effected by modulating the level of the composite signal with $\cos \phi$ as indicated in the equation (1).

The equation (1) can be rewritten as the following equation (2):

$$e_i = [\{1 + kL(t)\} \cdot \cos (\omega it + \pi/4) + \{1 + kR(t)\} \cdot \cos (\omega it - \pi/4)] \cdot \cos \phi / \sqrt{2}. \quad (2)$$

An example of a system for demodulating the stereophonic signal indicated by the equation (2) is shown in FIG. 1. In this system, a received input signal is converted into an intermediate frequency signal $e_i$ which is amplified by an IF (intermediate frequency) amplifier 3 and is then applied to a divider 4. In the divider 4, the $\cos \phi$ component of the intermediate frequency $e_i$ is removed and the resultant signal is applied to a quadrature stereophonic demodulator circuit 5. The quadrature stereophonic demodulation circuit 5 is composed of a product demodulator in the form of a differential circuit. The quadrature stereophonic demodulation circuit 5 provides as outputs the product of the output of the divider 4 and a signal component $\cos (\omega it + \pi/4)$ and the product of the output of the divider 4 and a signal component $\cos (\omega it - \pi/4)$, which outputs are the signal components $L(t)$ and $R(t)$, respectively. In order to provide the signal components $\cos \phi$, $\cos (\omega it + \pi/4)$ and $\cos (\omega it - \pi/4)$, a phase-locked loop (PLL) circuit 10 and phase shifters are employed.

The intermediate frequency signal $e_i$, after being converted into a square wave by a limiter 6, is applied to an input terminal of a phase comparator 7. The output of the phase comparator 7 is applied through a low-pass filter (LPF) 8 to a DC amplifier 9 where it is amplified and is then applied, as a control voltage, to a voltage-controlled oscillator (VCO) 11. The output $e_o$ of the voltage-controlled oscillator 11 is applied to the other input terminal of the phase comparator 7. As a result, the phase comparator 7 produces an error voltage $V_1$ corresponding to the frequency and phase difference of the input signal $e_i$ applied to the first input terminal of the phase comparator 7 with respect to $e_o$.

The output $e_o$ of the voltage-controlled oscillator 11 is applied to a $\pi/2$ phase shifter 12 where it is shifted by 90° in phase and is then applied to a first input terminal of an in-phase detector 13. The intermediate frequency signal $e_i$ is applied to the other input terminal of the in-phase detector 13 as a result of which the detector 13 produces as an output the $\cos \phi$ component which is applied to the divider 4.

The output of the $\pi/2$ phase shifter 12 is further applied to a $\pi/4$ phase shifter 14 and a $\pi/4$ phase shifter 15 where the phase of the output of the phase shifter 12 is shifted by +45° to −45° to produce the components $\cos (\omega it + \pi/4)$ and $\cos (\omega it - \pi/4)$, respectively. These components are applied to the quadrature demodulation circuit 5.

With the phase comparator 7 in the PLL circuit 10 producing an output voltage signal $V_1$ which is proportional to the cosine of the phase difference between the two input signals, the phase difference $\Delta \phi e$ of the two input signals is:

$$\Delta \phi e = \cos^{-1} \Delta \omega / Kd, \quad (3)$$

where $Kd$ is the loop gain of the PLL circuit and $\Delta \omega$ is the difference between the angular frequency $\omega i$ of the input signal $e_i$ and the free-running angular frequency of the voltage-controlled oscillator 11.

Thus, it is clear from the equation (3) that when $\Delta \omega$ is zero, that is, when the input signal $e_i$ is equal to the free-running frequency of the voltage-controlled oscillator, $\Delta \phi e$ is 90° and the phase of the output $e_o$ of the voltage-controlled oscillator 11 is shifted by 90° from the phase of the input signal $e_i$. Thus, the signal components $\cos \phi$, $\cos (\omega it + \pi/4)$ and $\cos (\omega it - \pi/4)$ obtained with the use of the signal $e_o$ have the desired phase relationships thereby permitting accurate quadrature stereophonic demodulation to be carried out.

However, if the frequency of the local oscillator signal $e_L$ is somewhat shifted in frequency due to temperature change or the like, then the frequency of the intermediate frequency signal $e_i$ will also be shifted as a result of which the difference $\Delta \omega$ will not be zero. In this case, the phase difference $\Delta \phi e$ between the signal $e_i$ and the output signal $e_o$ of the voltage-controlled oscillator varies with the angular frequency difference $\Delta \omega$ as indicated by the solid line 201 in FIG. 2.

As is apparent from the above description, it is known in the art that when the free-running frequency of the voltage-controlled oscillator is different from the frequency of the input signal $e_i$, the output $e_o$ of the voltage-controlled oscillator 11 is locked and follows the input signal although the phase thereof has a predetermined amount of shift $\Delta \phi e$ from the input signal $e_i$. Therefore, although the output of the voltage-controlled oscillator should be the signal $e_o$ whose phase is shifted exactly by 90° from that of the input signal $e_i$, the actual output is shifted by 90°±α from that of the input signal so that correct quadrature demodulation is not carried out.

SUMMARY OF THE INVENTION

Accordingly, an object of the invention is to provide a phase control device in which control is effected so that the phase of the output signal of the voltage-controlled oscillator in the PLL circuit has a fixed predetermined phase difference (90°) with respect to the input signal at all times.

In accordance with this and other objects of the invention, a phase control device according to the invention is provided which includes a variable phase shifter for varying the phase of the output signal from a voltage-controlled oscillator in a PLL circuit in accordance with a control voltage and phase comparison means for comparing the phase of the output of the variable phase shifter with the phase of the input signal, that is, the intermediate frequency signal $e_i$, to produce a control signal voltage for the variable phase shifter which varies according to the phase difference between the two compared signals wherein a signal having a constant phase difference (90° for example) with respect to the input signal $e_i$ is provided at the output of the variable phase shifter.

DESCRIPTION OF THE PREFERRED EMBODIMENTS

Figure 1:
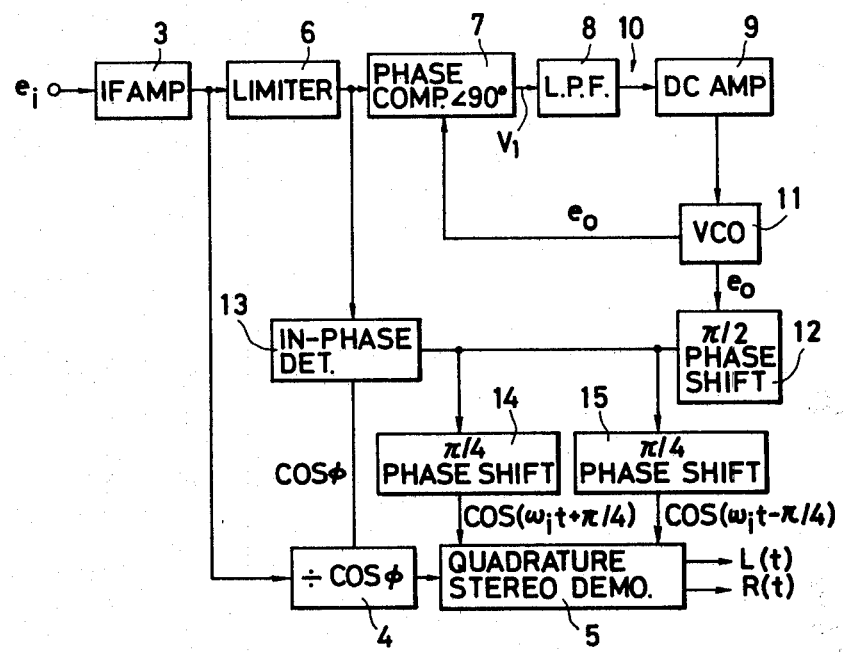
FIG. 1 is a block diagram showing a part of a conventional compatible quadrature AM stereophonic signal receiver.
Figure 3:
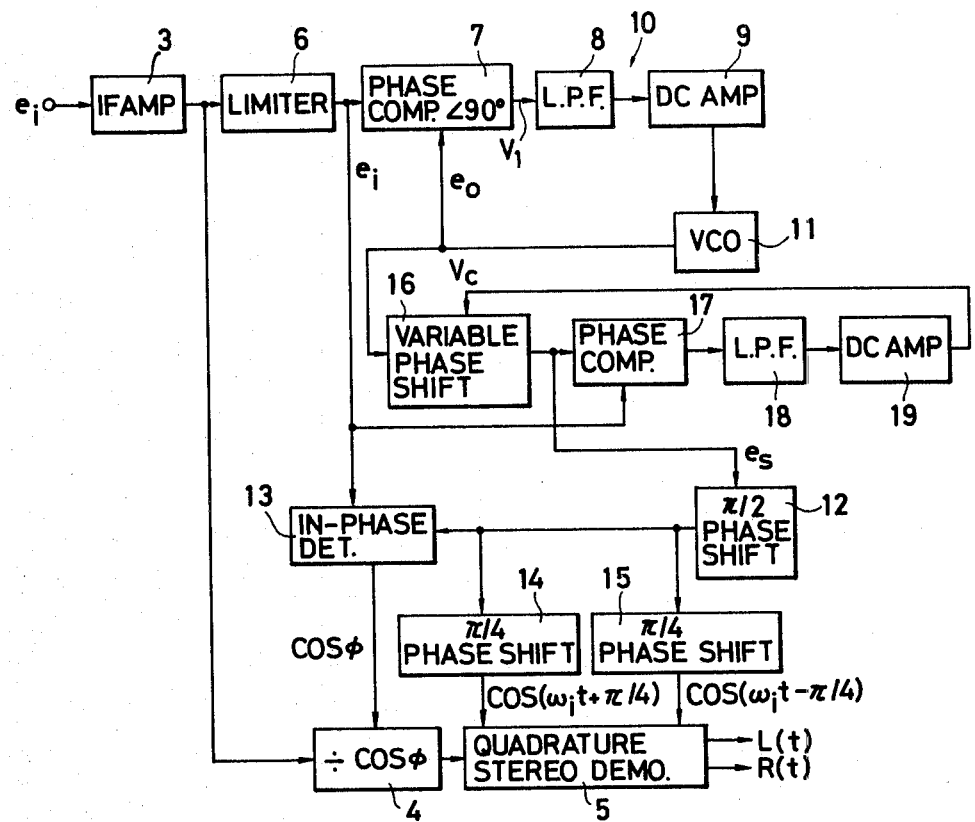
FIG. 3 is a block diagram showing a part of a compatible quadrature AM stereophonic signal receiver which employs a circuit according to the invention.

The invention will be described with reference to FIGS. 3 and 4. FIG. 3 is a block diagram showing a portion of a receiver circuit which utilizes to advantage a preferred embodiment of a phase control device according to the invention. In FIG. 3, those components which have been previously described with reference to FIG. 1 are therefore designated by like reference numbers and accordingly the discussion below will be primarily directed to those components which are different from those in FIG. 1.

The output $e_o$ of the voltage-controlled oscillator 11 is applied to the phase comparator 7 and a voltage-controlled type variable phase shifter 16. The output $e_s$ of the phase shifter 16 is applied to one input terminal of a phase comparator 17 to the other input terminal of which the output $e_i$ of the limiter 6 is applied. As a result, the phase comparator 17 produces as an output a difference signal corresponding to the phase difference between the two input signals.

The difference signal is converted into a DC voltage Vc by a low-pass filter 18 and a DC amplifier 19 and the DC voltage Vc is applied to the control voltage terminal of the variable phase shifter 16. The output $e_s$ of the phase shifter 16 is employed as the signal upon which quadrature demodulation is performed and is accordingly applied to the $\pi/2$ phase shifter 12 similar to the case of FIG. 1. The components in this circuit are chosen such that, when the intermediate frequency signal $e_i$ is equal to the free-running frequency $f_o$ of the voltage-controlled oscillator 11, the phase difference between the intermediate frequency signal $e_i$ and the output $e_o$ of the voltage-controlled oscillator 11 is 90° and the amount of phase shift through the voltage-controlled variable phase shifter 16 is zero. If, under this condition, the frequency $f_i$ of the input signal $e_i$ is shifted from the free-running frequency $f_o$ of the voltage-controlled oscillator, the voltage-controlled oscillator 11 will follow the shift by operation of the PLL circuit 10. As a result, the frequency of the output $e_o$ becomes $f_i$ and the phase of the output $e_o$ varies in proportion to $|f_i - f_o|$ so that the phase is locked with a phase shift of $90° \pm \alpha$ from the phase of the input signal.

Accordingly, the phase comparator 17 produces a signal proportional to $(90° \pm \alpha)$ in response to which the DC control voltage Vc is produced by the low-pass filter 18 and the DC amplifier 19 which is then applied to the control voltage terminal of the variable phase shifter 16 to thereby control the amount of phase shift of the phase shifter. In this manner, the phase of the output $e_o$ from the voltage-controlled oscillator 11 is controlled so that the phase difference between the output $e_s$ of the phase shifter 16 and the input $e_i$ is held at 90°.

Figure 4:
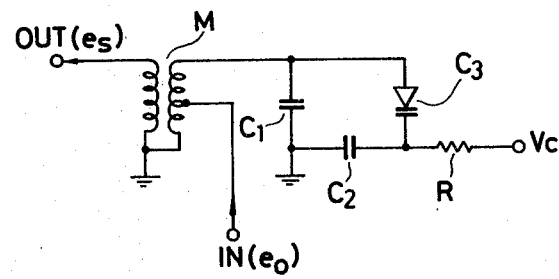
FIG. 4 is a circuit diagram showing an example of a variable phase shifter in FIG. 3.

An example of a circuit implementation of the variable phase shifter 16 is as shown in FIG. 4. An input signal $e_o$ to be phase-shifted is applied to the mid-point of the primary winding of a transformer and a phase-shifted output signal $e_s$ is provided across the secondary winding. The control voltage Vc is applied through a resistor R to a varicap diode C3 coupled to the primary winding so as to vary the capacitance of the diode C3 and to thereby control the equivalent capacitance of the primary winding side of the transformer.

It goes without saying that the phase shifter used in the invention is not limited to that shown in FIG. 4. That is, various other phase shifters may be used in place of that shown in FIG. 4.

Figure 2:
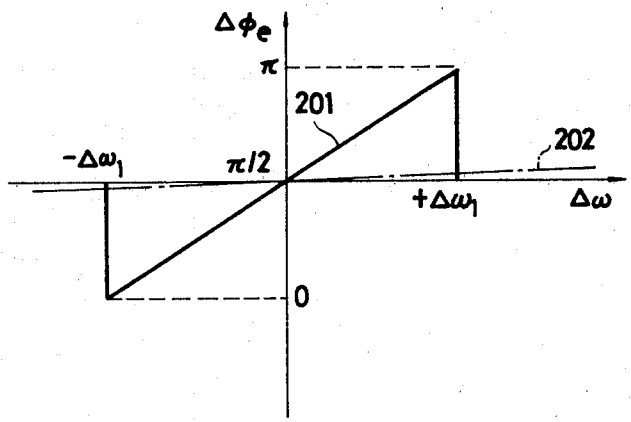
FIG. 2 is a graphical representation utilized for making a comparison between the circuit shown in FIG. 1 and a circuit according to the invention.

As is indicated by the broken line 202 in FIG. 2, the signal $e_s$ which is produced has a phase difference of about 90° with respect to the input signal $e_i$ and has the same frequency as the input signal in the lock range, corresponding to the range of $\pm \Delta \omega_1$, of the PLL circuit 10 and, accordingly, the signal components $\cos \phi$, $\cos (\omega_i t + \pi/4)$ and $\cos (\omega_i t - \pi/4)$ have the desired phase relationships thereby permitting accurate quadrature stereophonic demodulation to be carried out.

As is clear from the above description, according to the invention, even if the local oscillator signal frequency varies as caused by temperature change or the like so that the frequency of the intermediate frequency signal $e_i$ changes, the output signal nonetheless remains equal in frequency to the intermediate frequency signal $e_i$ and has a substantially constant phase difference of 90° with respect to the signal $e_i$. Thus, the compatible quadrature AM stereophonic signal can be demodulated correctly.

What is claimed is:

1. A received signal phase control circuit comprising: a voltage-controlled oscillator whose output frequency varies in accordance with a control signal coupled to an input of said voltage-controlled oscillator; a first phase comparator for comparing the phase of an output of said voltage-controlled oscillator with the phase of an input signal to said phase comparator, said control signal being produced in accordance with an output of said phase comparator and having a phase determined by the phase difference between said output of said voltage controlled oscillator and said input signal; a phase control device for controlling the phase of an output of said voltage-controlled oscillator comprising: a variable phase shifter for varying the phase of an output of said voltage-controlled oscillator in accordance with a control voltage coupled to an input of said phase shifter; and a second phase comparator for comparing the phase of an output of said variable phase shifter with the phase of said input signal to said first phase comparator, said control voltage being produced in accordance with an output of said second phase comparator and having a phase determined by the phase difference between said output of said phase shifter and said input signal to said first phase comparator, a signal having a constant phase difference with respect to said input signal being provided at said output of said variable phase shifter.

2. The phase control circuit of claim 1 further comprising: a low pass filter having an input applied to said output of said second phase comparator and a DC amplifier having an input coupled to an output of said low pass filter, said control voltage being produced at an output of said DC amplifier.

3. The phase control circuit of claim 1 or 2 wherein said variable phase shifter comprises: a transformer having primary and secondary windings and a voltage variable capacitor coupled to effect the frequency of resonance of a circuit including said primary winding, said control voltage being coupled to a center tap of said primary winding and said output of said variable phase shifter being formed across said secondary winding.

4. A received signal phase control circuit comprising: an IF amplifier; a limiter having an input coupled to an output of said IF amplifier; a first phase comparator having an input coupled to an output of said limiter; a first low pass filter having an input coupled to an output of said first phase comparator; a first DC amplifier having an input coupled to an output of said low pass filter; a voltage-controlled oscillator having an input coupled to an output of said first DC amplifier, an output of said voltage-controlled oscillator being coupled to a second input of said first phase comparator; a variable phase shifter having an input coupled to said output of said voltage-controlled oscillator; a second phase comparator having a first input coupled to an output of said variable phase shifter, a second input of said phase comparator being coupled to said output of said limiter; a second low pass filter having an input coupled to an output of said second phase comparator; a second DC amplifier having an input coupled to an output of said low pass filter, an output of said DC amplifier being coupled to a second input of said variable phase shifter; a 90° phase shifter having an input coupled to said output of said variable phase shifter; an in-phase detector having a first input coupled to said output of said limiter and a second input coupled to an output of said 90° phase shifter; first and second 45° phase shifters having inputs coupled to said output of said 90° phase shifter; a divider having a first input coupled to said output of said IF amplifier and a second input coupled to an output of said in-phase detector; and a quadrature stereo demodulator having a first input coupled to said divider and second and third inputs coupled to outputs of said first and second 45° phase shifters.

5. The phase control circuit of claim 4 wherein said variable phase shifter comprises: a transformer having primary and secondary windings and a voltage variable capacitor coupled to effect the frequency of resonance of a circuit including said primary winding, said output of said voltage controlled oscillator being coupled to a center tap of said primary winding and said output of said variable phase shifter being formed across said secondary winding.

* * * * *